(12) United States Patent
Ueda (10) Patent No.: US 8,040,650 B2
(45) Date of Patent: Oct. 18, 2011

(54) EXCESS-CURRENT PROTECTION CIRCUIT AND POWER SUPPLY

(75) Inventor: Yuuichi Ueda, Ikeda (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/725,782

(22) Filed: Mar. 17, 2010

(65) Prior Publication Data

US 2010/0238595 A1    Sep. 23, 2010

(30) Foreign Application Priority Data

Mar. 17, 2009    (JP) ................. 2009-064445

(51) Int. Cl.
*H02H 3/08* (2006.01)
*H02H 9/02* (2006.01)
*H02H 9/08* (2006.01)

(52) U.S. Cl. .................... 361/93.1; 361/93.9

(58) Field of Classification Search ............. 361/93.1, 361/93.9
See application file for complete search history.

(56) References Cited

U.S. PATENT DOCUMENTS 7,339,775 B2 *    3/2008    Kimura ............... 361/93.1

FOREIGN PATENT DOCUMENTS

| JP | 4-32543 | 3/1992 |
|---|---|---|
| JP | 3498736 | 12/2003 |
| JP | 2005-333691 | 12/2005 |

* cited by examiner

*Primary Examiner* — Dharti Patel
(74) *Attorney, Agent, or Firm* — Cooper & Dunham LLP

(57) ABSTRACT

An excess-current protection circuit includes an outer input terminal, an outer output terminal, a driver transistor connected between the input terminal and the output terminal to control an excess current, an excess-current control circuit, and an excess-current detection circuit. The excess-current control circuit compares a predetermined first bias voltage with a voltage obtained by a current flowing through a first sense transistor multiplied by a resistance value of a sense resistor and controls the gate voltage of the driver transistor in accordance with a comparison result. The excess-current detection circuit compares voltage difference between the drain and source of the driver transistor with a predetermined second bias voltage and controls the gate voltage of the driver transistor in accordance with a comparison result.

19 Claims, 11 Drawing Sheets

EXCESS-CURRENT PROTECTION CIRCUIT AND POWER SUPPLY

CROSS-REFERENCE TO RELATED APPLICATIONS

This patent specification claims priority from Japanese Patent Application No. 2009-064445, filed on Mar. 17, 2009 in the Japan Patent Office, which is hereby incorporated by reference herein in its entirety.

BACKGROUND

1. Technical Field

This disclose relates to an excess-current protection circuit to control an excess current flowing to a power supply device, and a power supply including the excess-current protection circuit.

2. Discussion of the Background

In general, excess-current protection circuits for protecting power supply systems from excessive current by limiting the amount of current flowing through the power supply system are provided.

Figure 11:
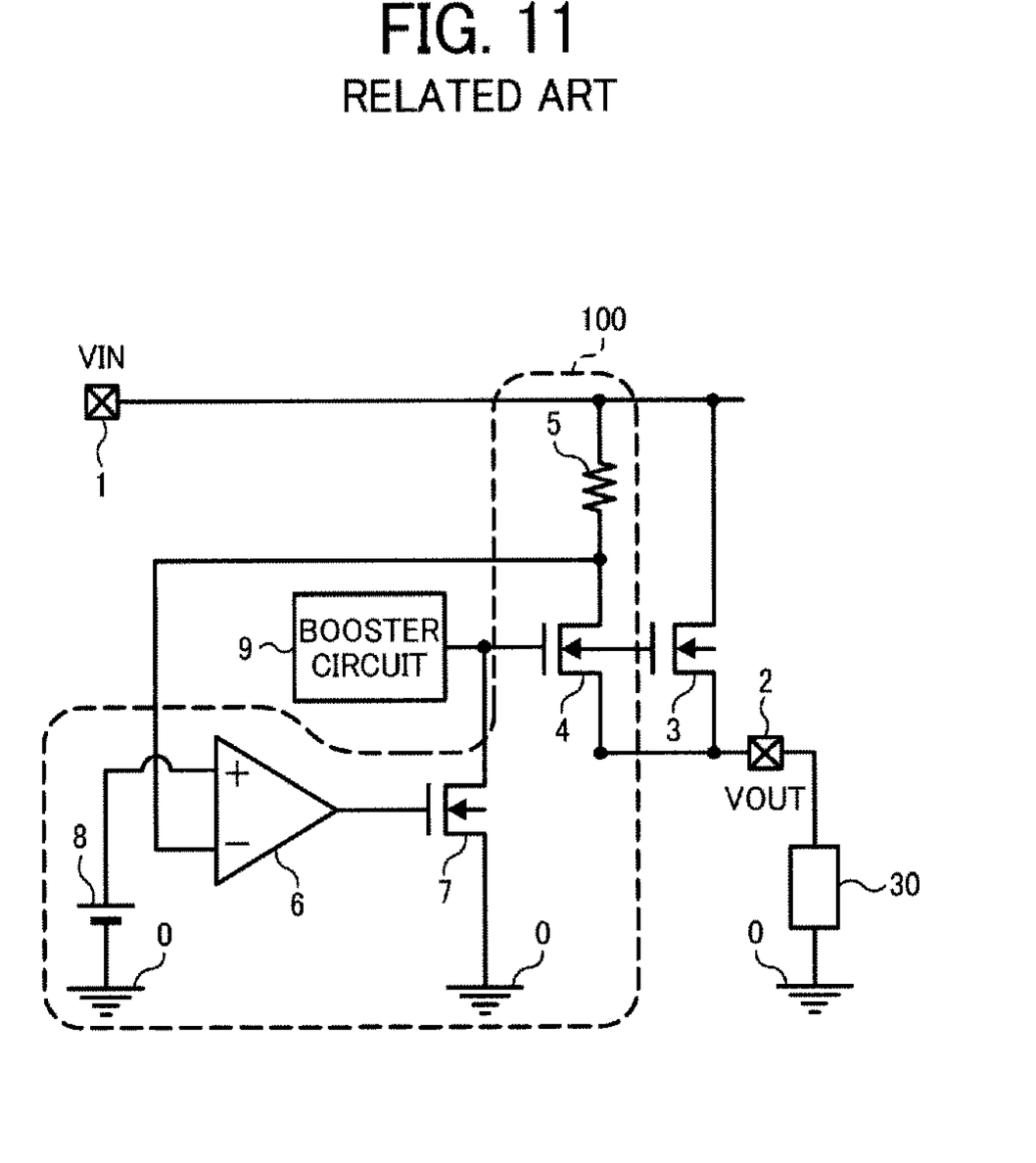
FIG. 11 illustrates circuitry of a related-art power supply including an excess-current protection circuit.

For example, one related-art power supply circuit includes an excess-current protection circuit as shown in FIG. 11. The protection circuit 100 is formed by an excess-current control circuit 100, an input terminal 1, an output terminal 2, a driver transistor 3, a booster circuit 9, and a load 30. The excess-current control circuit 100 includes a sense resistor 5, a first sense transistor 4, a first comparator 6, an output metal-oxide-semiconductor (MOS) transistor 7, and a voltage source 8. The sense resistor 5 and the first sense transistor 4 are connected in parallel to the driver transistor 3. The voltage source 8 produces a predetermined voltage as a first bias voltage Vb1.

The first comparator 6 compares the first bias voltage Vb1 and a voltage V45 obtained by the current I4 flowing through the first sense transistor 4 multiplied by a resistance R5 of the sense resistor 5 (V45=I4×R5) and controls the output MOS transistor 7 based on the output result of this comparison. Then, the output MOS transistor 7 controls the gate voltage Vg-3 of the driver transistor 3.

Figure 12A:
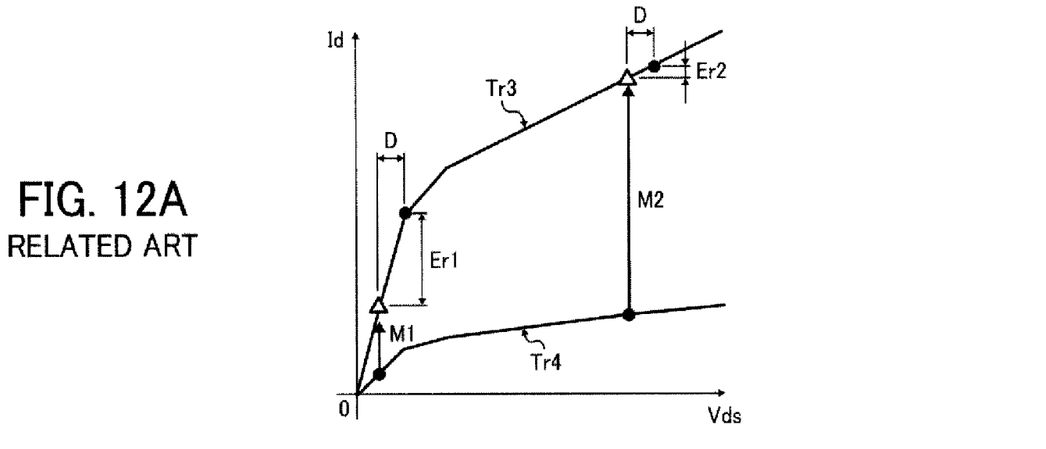
FIGS. 12A and 12B are graphs of voltage-current curve of transistors included in the excess-current protection circuit shown in FIG. 11.
Figure 12B:
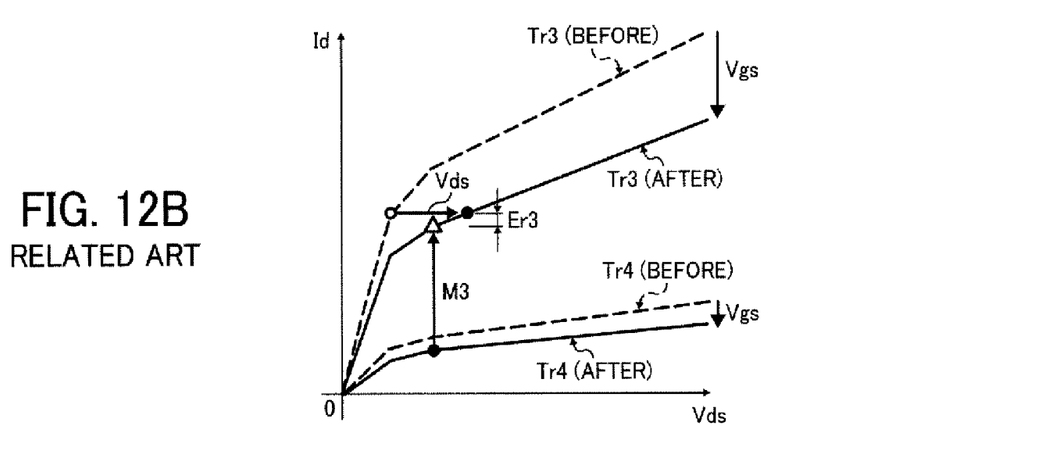

FIGS. 12A and 12B are graphs of voltage-current curves of the driver transistors 3 and the first sense transistor 4. FIG. 12A shows a state before the excess current is detected, and FIG. 12B shows a state after the excess current is detected. In FIGS. 12A and 12B, a reference numeral Tr3 indicates properties of the driver transistor 3, and a reference numeral Tr4 indicates properties of the first sense transistor 4. Additionally, reference marks • indicate measured values, and reference numerals Δ show ideal values. Reference numerals M1 and M2 indicate multiplication to calculate the ideal value in accordance with a channel area ratio between the driver transistor 3 and the first sense transistor 4. The reference mark D indicates a difference between a drain-source voltage Vds-3 of the driver transistor 3 and a drain-source voltage Vds-4 of the first sense transistor 4. Reference numerals Er1 and Er2 indicate current errors due to channel-length modulation effects.

When the output current IOUT flows from the output terminal 2 to the load 30, because a voltage drop occurs at the sense resistor 5 that is directly connected to the first sense transistor 4, a drain-source voltage Vds-4 between the drain and the source of the first sense driver transistor 4 becomes smaller than the voltage Vds-3 between the drain and the source of the driver transistor 3.

More specifically, a measured current I4 flowing through the first sense transistor 4 becomes smaller than an ideal value thereof. The ideal value of the current I4 is the value of the current I3 flowing through the driver transistor 3 divided by the area ratio. For example, if a channel area ratio of the driver transistor 3 and the first sense transistor is designed to be k:1, the ideal value of the current I3 is k times the current I4.

Conversely, as shown in FIG. 12A, the measured current I3 flowing through the driver transistor 3 becomes larger than the ideal value of the current I3 calculated based on the measured current I3 and the channel area ratio Consequently, because of the difference in the drain-source voltages Vds-3 and Vds-4, the current error from the channel-length modulation occurs, and therefore, the excess-current control circuit 100 detects the excess current at larger current than a predetermined current due to the error. In particular, with reference to Er1 compared with Er2 in FIG. 12A, when the drain-source voltage Vds-3 is in small linear region, the drain-source voltage Vds-3 has a major impact on the drain current Id and the increase in the excess current detected value is especially pronounced.

In FIG. 12B, solid lines indicate properties of the transistors 3 and 4 after the excess-current control circuit 100 detects the excess current, and dashed lines indicate the property of the transistors 3 and 4 before the detection. After the excess current is detected, the first comparator 6 outputs the output signal as an excess-current signal, thereby controlling the output MOS transistor 7, and a voltage Vgs applied to the gate of the first sense transistor 4 decreases. Therefore, gate-source voltages Vgs of the driver transistor 3 and the first sense transistor 4 decrease. As a result, the drain-source voltages Vds of the driver transistor 3 and the first sense transistor 4 increase, which transmits the current in an attempt to make the excess-current protection circuit operate normally.

That is, the respective currents value Id converges at a predetermined value calculated by the area ratio between the driver transistor 3 and the first sense transistor 4, a resistance value of the sense resistor 5, and the first bias voltage Vb1 generated from the constant-voltage source 8.

Figure 13:
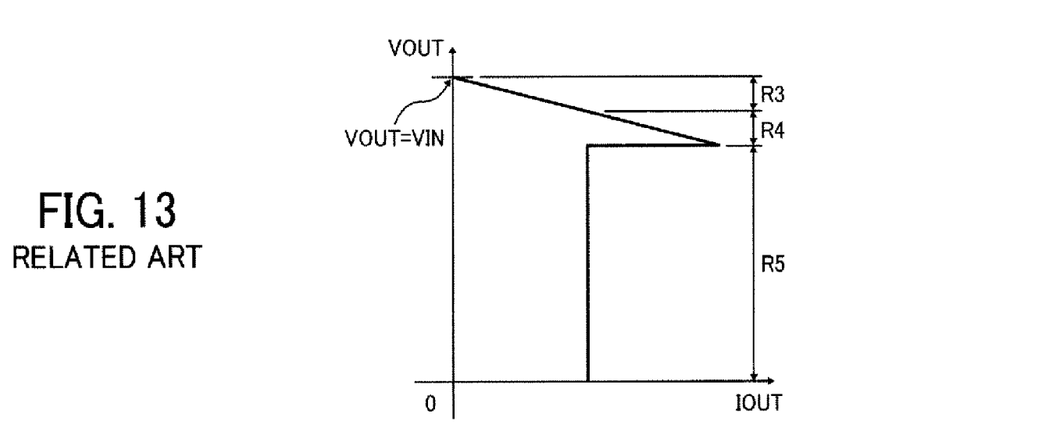
FIG. 13 is a graph of a voltage-current curve illustrating a relation between an output current IOUT and an output voltage VOUT when only excess-current control circuit 100 of FIG. 11 is used as the excess-current protection circuit.

FIG. 13 is a graph of a voltage-current curve illustrating a relation between an output current TOUT and an output voltage VOUT when only the excess-current control circuit 100 is used as the excess-current protection circuit. In FIG. 13, in a power supply including the excess-current protection circuit 100 as described above, the output voltage value VOUT can be relatively small (close to 0V) and kept constant in a voltage region R5.

Additionally, in a voltage region R3, as the output voltage VOUT decreases, the current I3 assumes a value that is equal to a voltage difference (Vdif) between the input voltage VIN and the output voltage VOUT divided by a drain-source resistance Rds-3 of the driver transistor 3, and flows to the driver transistor 3. (IOUT=Vdif/Rds-3)

However, in a voltage region R4, that is, the region right before the excess current is detected, the output current IOUT jumps because the detected output current IOUT increases excessively.

In short, in this excess-current protection circuit using only the excess-current control circuit 100, the detected value of the excess current increases, which is a problem.

In view of the foregoing, there is market demand for power supplies including an excess-current protection circuit that detects an excess-current without increasing a detected value of the excess-current.

BRIEF SUMMARY

In an asect of this disclosure, there is provided an excess-current protectioncircuit that includes an outer input terminal, an outer output terminal, and a driver transistor connected between the input terminal and the output terminal to control an excess current, and an excess-current control circuit. The excess-current control circuit includes a first sense transistor connected in parallel to the driver transistor to flow a current in accordance with a predetermined ratio through the driver transistor, a sense resistor connected between the first sense transistor and the outer input terminal, a first comparator to compare a predetermined first bias voltage with a voltage obtained by a current flowing through the first sense transistor multiplied by a resistance value of the sense resistor and output an output signal based on a comparison result, a control member to control a gate voltage of the driver transistor in accordance with the output signal from the first comparator. The excess-current detection circuit compares a voltage difference between the drain and source of the driver transistor with a predetermined second bias voltage and controls the gate voltage of the driver transistor in accordance with a comparison result.

In another aspect, there is provided a power supply to change an input voltage applied to an input terminal and output a specified voltage from an output terminal, including an input terminal, an output terminal, a load, and an excess-current protection circuit described above, to prevent excess current from flowing to the output terminal.

BRIEF DESCRIPTION OF THE DRAWINGS

A more complete appreciation of the aforementioned and other features, aspects and advantages will be better understood by reference to the following detailed description when considered in connection with the accompanying drawings, wherein.

DETAILED DESCRIPTION OF PREFERRED EMBODIMENTS

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve a similar result.

Referring now to the drawings, wherein like reference numerals designate identical or corresponding parts throughout the several views thereof, particularly to FIGS. 1 and 2, an excess-current protection device according to an example embodiment of the present invention is described below.

First Embodiment

Figure 1:
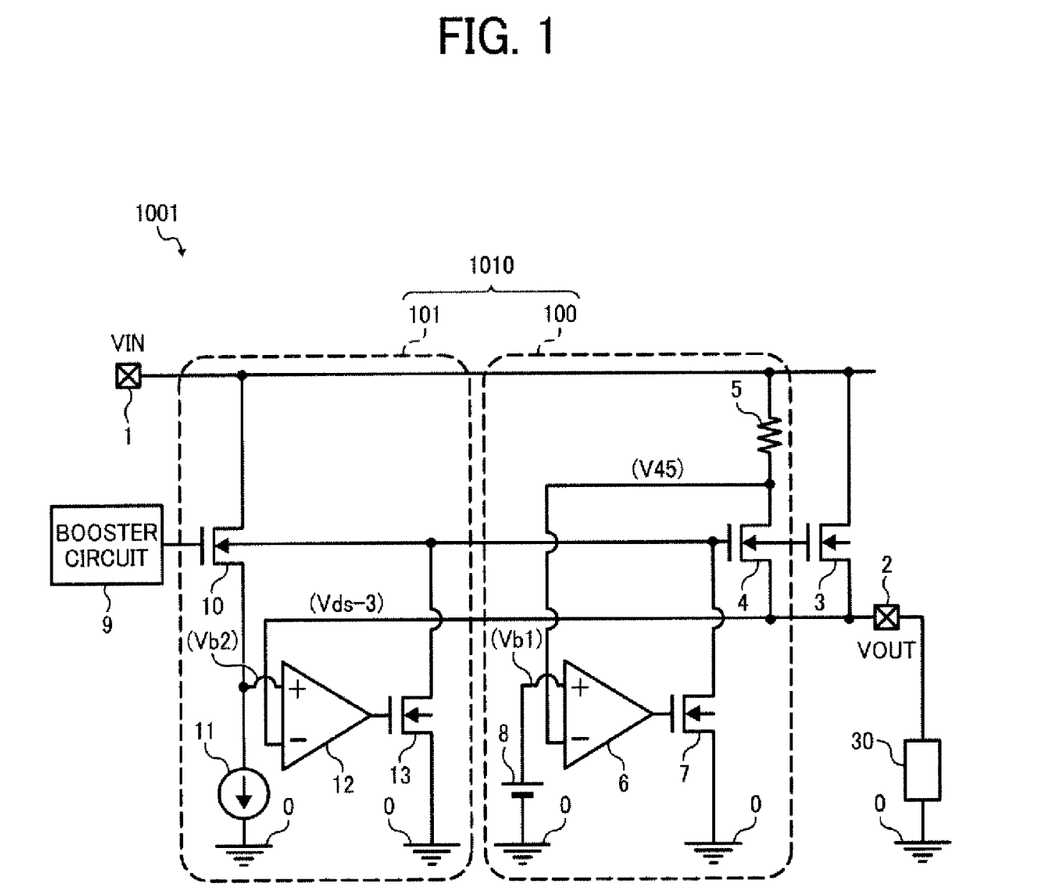
FIG. 1 illustrates circuitry of a power supply including an excess-current protection circuit according to a first illustrative embodiment.

FIG. 1 illustrates circuitry of a power supply 1001 including an excess-current protection circuit 1010 according to a first embodiment.

The excess-current protection device 1010 is formed by the excess-current control circuit 100 the excess-current detection circuit 101 serving as a first excess-current control circuit, and the excess-current detection circuit 101. Both the excess-current control circuit 100 and the excess-current detection circuit 101 detect the excess-current flowing to the transistor 3. The excess-current detection circuit 101 and the excess-current control circuit 100 control the excess current of the output current IOUT in a difference voltage region described in further detail later.

The power supply 1001 includes an input terminal 1, an output terminal 2, a driver transistor 3, a booster circuit 9, an excess-current detection circuit 101, and an excess-current control circuit 100. An input voltage VIN is supplied to the input terminal 1, and an output voltage VOUT that is outputted from the output terminal 2 to a load 30. The driver transistor 3 is connected between the input terminal 1 and the output terminal 2. The booster circuit 9 outputs the increased voltage to the gate of the driver transistor 3. The excess-current detection circuit 101 detects an excess current flowing through the driver transistor 3, and the excess-current control circuit 100 controls the excess current flowing through the driver transistor 3.

The excess-current control circuit 100 includes a sense resistor 5, a first sense transistor 4, a first comparator 6, an output MOS transistor 7, and a voltage source 8. The sense resistor 5 and the first sense transistor 4 are connected in parallel to the driver transistor 3. The voltage source 8 produces a predetermined voltage as a first bias voltage Vb1.

In the first comparator 6, a non-inverting input terminal (+) is connected to the voltage source 8, and an inverting input terminal (−) thereof is connected a junction node between the sense resistor 5 and the drain of the first sense transistor 4.

The gate of the output MOS transistor 7 is connected to an output terminal of the first comparator 6, its source is connected to the ground terminal 0, and its drain is connected to the gate of the first sense transistor 4. The output MOS transistor serves as a control member.

The gate of the first sense transistor 4 and the gate of the driver transistor 3 are connected in common to the booster circuit 9. The source of the first sense transistor 4 and the source of the driver transistor 3 and are connected in common to the output terminal 2.

In this circuit, a channel area of the first sense transistor 4 is smaller than that of the driver transistor 3, and a current I4 flows to the first sense transistor 4 in accordance with a ratio between the channel area of the driver transistor 3 and the first sense transistor 4. The sense resistor 5 is connected between the input terminal 1 and the drain of the first sense transistor 4.

The first comparator 6 compares a the first bias voltage Vb1 and a voltage V45 obtained by the current I4 flowing through the first sense transistor 4 multiplied by a resistance R5 of the sense resistor 5 (V45=I4×R5) and outputs an output signal based on a result of this comparison.

The output MOS transistor 7 controls a gate voltages Vg of the driver transistor 3 and the first sense transistor 4 based on the output signal from the first comparator 6. Thus, an excess-current control is executed.

In the excess-current control circuit 100, because the current flowing through the sense resistor 5 and the first sense transistor 4 flows to the load 30 via the output terminal 2, the current does not cause power consumption in the integrated circuit. Therefore, the channel area ratio of the driver transistor 3 to the first sense transistor 4 can be decreased. Consequently, fluctuation in a ratio between the current I3 flowing to the driver transistor 3 and the current I4 flowing to the first sense transistor 4 can be prevented.

The excess-current detection circuit 101, serving as a second excess-current control circuit, includes a second sense transistor 10, a constant-current source 11, a second comparator 12, and an output MOS transistor 13. In the second comparator 12, a non-inverting input terminal (+) is connected to a junction node between the source of the second sense transistor 10 and the constant-current source 11, and an inverting input terminal (−) thereof is connected to the source of the driver transistor 3. An output terminal of the second comparator 12 is connected to the gate of the output MOS transistor 13. The drain of the output MOS transistor 13 is connected to the gate of the first sense transistor 4 and the gate of the driver transistor 3.

The second sense transistor 10 is connected between the input terminal 1 and the constant-current source 11. The gates of the second sense transistor 10, the driver transistor 3, and the first sense transistor 4 and input terminals (body terminals) of the second sense transistor 10, the driver transistor 3, and the first sense transistor 4 are connected in common to the booster circuit 9.

Herein, a second bias voltage Vb2 is generated by the constant-current source 11 and the second sense transistor 10. Then, the second comparator 12 compares the second bias voltage Vb2 and the voltage Vds-3 between the drain and the source of the driver transistor 3 generated by flowing a load current to the driver transistor 3, and outputs an output signal based on a result of this comparison.

The output MOS transistor 13 controls the gate voltage Vg of the driver transistor 3 based on the output signal from the second comparator 12. Thus, excess-current detection is executed.

In the excess-current detection circuit 101, the second sense transistor 10 is formed of an element type identical to that of the driver transistor 3, and therefore a channel area of the second sense transistor 10 is similar to that of the driver transistor 3.

Accordingly, regardless of fluctuations in temperature and processing, the excess current can be detected accurately.

Further, a detected value of the excess-current is determined exclusively by a resistance Rds10 between the drain and the source of the transistor 10 and the current I11 produced from the constant-current source 11, independently of the operating region in the transistors.

Consequently, the excess-current detection circuit 101 can detect the excess current even when a drain-source voltage Vds-3 of the driver transistor 3 and a drain-source voltage Vds-10 of the second sense transistor 10 are in the small voltage region.

In the power supply 1001 in FIG. 1, the sources of output MOS transistors 7 and 13, a terminal of the voltage source 8, a terminal of the constant-current source 11, and a terminal of the load 30 are connected to respective ground terminals 0. When the voltage outputted from the output terminal 2 is lower than the excess-current detection voltage, and the excess-current detection circuit 101 is operated, the excess-current detection circuit 101 controls the current such that the output current is higher than the current when the voltage outputted from the output terminal 2 is equal to the excess-current detection voltage.

Operation of the Excess-Current Protection Device

Figure 2A:
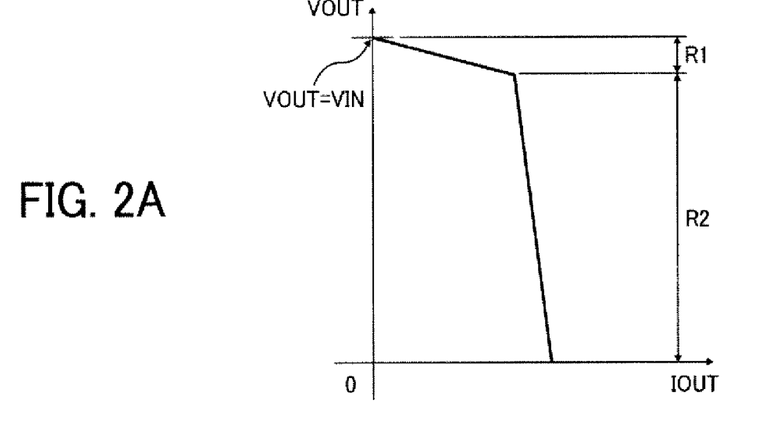
FIG. 2A is a graph of a voltage-current curve illustrating a relation between an output current IOUT and an output voltage VOUT when an excess-current detection circuit is used alone in an excess-current protection circuit.

FIG. 2A is a graph of a voltage-current curve illustrating a relation between an output current IOUT and an output voltage VOUT when the excess-current detection circuit 101 is used alone in an excess-current protection circuit.

Figure 2B:
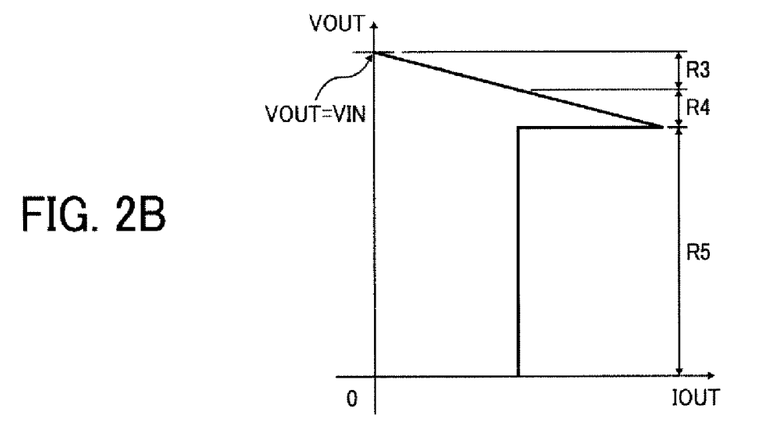
FIG. 2B is a graph of a voltage-current curve illustrating a relation between an output current IOUT and an output voltage VOUT when an excess-current control circuit is used alone as the excess-current protection circuit.

FIG. 2B is a graph of a voltage-current curve illustrating a relation between an output current IOUT and an output voltage VOUT when the excess-current control circuit 100 is used alone as an excess-current protection circuit.

Figure 2C:
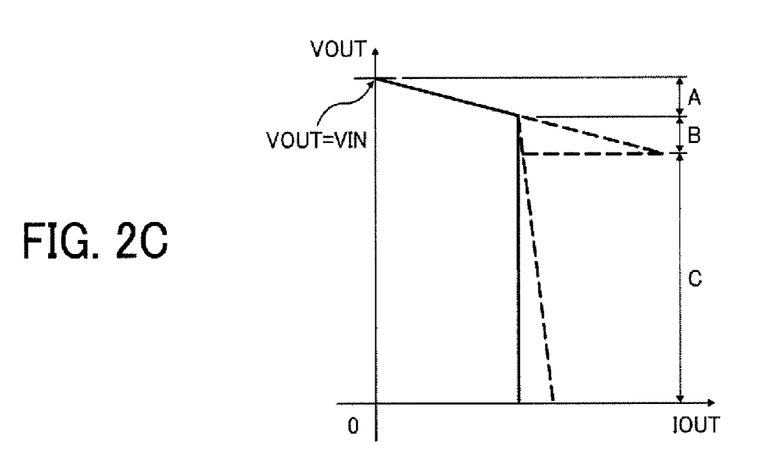
FIG. 2C is a graph of a voltage-current curve illustrating a relation between an output current IOUT and an output voltage VOUT when the excess-current detection circuit and the excess-current control circuit are together used as the excess-current protection circuit shown in FIG. 1.

FIG. 2C is a graph of a voltage-current curve illustrating a relation between an output current and an output voltage VOUT when the excess-current detection circuit 101 and the excess-current protection circuit 100 are together used as the excess-current protection circuit 1010 according to the present embodiment.

Herein, the output current IOUT means a current I3 flowing to the driver transistor 3.

In FIG. 2A, at a start point of the voltage-current curve, that is, when the output voltage VOUT is equal to the input voltage VIN (VIN=VOUT), there is no current I3 flowing to the driver transistor 3.

In a voltage region R1, as the output voltage VOUT decreases, the current I3 assumes a value equal to a voltage difference (Vdif) between the input voltage VIN and the output voltage VOUT divided by the drain-source resistance Rds-3 of the driver transistor 3 and flows to the driver transistor 3. (I3=Vdif/Rds-3)

When the current I3 flowing to the driver transistor 3 reaches a predetermined set value, the current is detected as an excess current. At this time, the second comparator 12 outputs an excess current detection signal, and accordingly the output transistor 13 is turned ON. Then, a gate-source voltage Vgs of the driver transistor 3 decreases. As the output voltage VOUT further decreases, the voltage Vgs is further decreased. Consequently, the resistance Rds3 between the drain and the source of the driver transistor 3 increases.

At this time, a drain-source resistance Rds10 of the second sense transistor 10 also increases. Therefore, the second bias voltage Vb2 increases, and the current I3 flowing to the driver transistor 3 is controlled within a predetermined range.

However, it is difficult for the excess-current detection circuit 101 to maintain the resistance ratio between a resistance Rds3 of the driver transistor 3 and the resistance Rds10 of the sense transistor 10 constant in the entire voltage region of the output voltage VOUT. Therefore, even after the excess-current is detected, the current I3 may fluctuate due to changes in the resistance ratio therebetween, As one example, FIG. 2A illustrates the current I3 when the current I3 increases due to changes in the resistance ratio in a voltage region R2. In the excess-current detection circuit 101, a current I11 of the constant-current source 11 that is directly connected to the second sense transistor 10 is generated as a loss in the integrated circuit.

In order to reduce this loss, in the constitution of excess-current detection circuit 101, the area ratio of the driver transistor 3 to the second sense transistor 10 is increased by narrowing the channel width of the second sense transistor 10 or using cascade connecting multiple sense transistors as the second sense transistors 10.

In this case, the deviation of the element, fluctuation in the resistance ratio, imbalance of the voltage Vds may occur, and therefore, detection accuracy of the excess-current value and accuracy of the excess-current control value may be degraded.

As described above, the advantage of the excess-current detection circuit 101 is that the excess-current detection circuit 101 can operate (can detect the excess current) even when the voltage Vds-3 between the drain and the source voltage of the driver transistor 3 is small. By contrast, a drawback is that it is difficult to keep the current IOUT constant in the entire output voltage region.

As described above, the advantage of the excess-current control circuit 100 is that the excess-current control circuit 101 can keep the excess current constant when the drain-source voltages Vds-3 of the driver transistor 3 and the drain-source voltages Vds-4 of the first sense transistor 4 are relatively large. By contrast, a drawback is that the large excess current flows when the drain-source voltages Vds-3 and Vds-4 are small.

By contrast, the excess-current protection circuit 1001 shown in FIG. 2C combines the features of the excess-current detection circuit 101 in FIG. 2A and the excess-current control circuit 100 to provide an unexpected effect, as is described in detail below.

In FIG. 2C, when the output voltage VOUT is equal to the input voltage VIN, (VOUT=VIN), the current I3 flowing trough the transistor 3 is 0V. As the output voltage VOUT decreases, a current IOUT (a load current) flowing from the output terminal 2 to the driver transistor 3 increases accordingly. At this time, in a voltage region A in FIG. 2C, a gradient of the current IOUT follows a drain-source resistance Rds3 of the driver transistor 3 with no limitations on the gate-source voltages Vgs from the excess-current detection circuit 101 and the excess-current control circuit 100.

In a voltage region B in FIG. 2C, because the drain-source voltage Vds-3 of the driver transistor 3 is small, the excess-current control circuit 100 does not operate, or operates with large error.

By contrast, because the excess-current detection circuit 101 can operate accurately in the voltage region B, the excess-current detection circuit 101 controls the gate voltages Vg of the respective driver transistor 3 and the sense transistors 1 and 10 in sync with the arrival of the current I3 to the excess-current detection setting value.

The Output Current IOUT After the Current I3 Flowing Through the Driver Transistor 3 Reaches the Detection Setting Value is the Excess Current Subsequently, as the excess-current detection circuit 101 reduces the gate-source voltage Vgs of the respective transistors, the voltage Vds-3 between the drain and the source of the transistor 3 increases. This state is transmitted as is to the area in which the excess-current control circuit 100 can operate normally, in a voltage region C in FIG. 2C.

In the excess-current protection circuit 1010 shown in FIG. 1, the negative-channel (N-channel) MOS transistors 7 and 13 configure open drain output of the excess-current control circuit 100 and the excess-current detection circuit 101, respectively. Since these drains of the transistors 7 and 13 constitute a wired OR circuit that connected in common to the gate of the driver transistor 3 in the excess-current protection circuit 1010, the gate voltage of transistor 3 are affected from the excess-current control circuit 100 or the excess-current detection circuit 101. Consequently, in the excess-current protection circuit 1010, the output voltage VOUT can be selected from the excess-current control circuit 100 or the excess-current detection circuit 101.

As can be appreciated by those skilled in the art, the advantage of this configuration is that operations of the excess-current control circuit 100 and the excess-current detection circuit 101 do not interfere with each other, and the output current IOUT at a given output voltage VOUT is selected according to whether the output current IOUT is lower at the same voltage VOUT in the excess-current control circuit 100 or at the excess-current detection circuit 101.

In this embodiment, because the detected value of the excess-current control circuit 100 is designed to be higher than the control value of the excess-current detection circuit 101, in the voltage region C shown in FIG. 2C where the output voltage VOUT is dramatically smaller than the input voltage VIN, the operation of the excess-current control circuit 100 gets preference over the operation of the excess-current detection circuit 101. As a result, a constant voltage can be obtained even when the output voltage VOUT fluctuates.

As described above, the excess-current protection circuit 1010 uses the excess-current control circuit 100 and the excess-current detection circuit 101 together, and which can operate when the drain-source voltage Vds is relatively small. As a result, increasing the excess-current detected value can be avoided even when the drain-source voltage Vds is relatively small.

Therefore, the excess-current protection circuit 1010 can enhance the accuracy of excess-current detection and attain high excess-current control over a wide output voltage region.

Second Embodiment

Figure 3A:
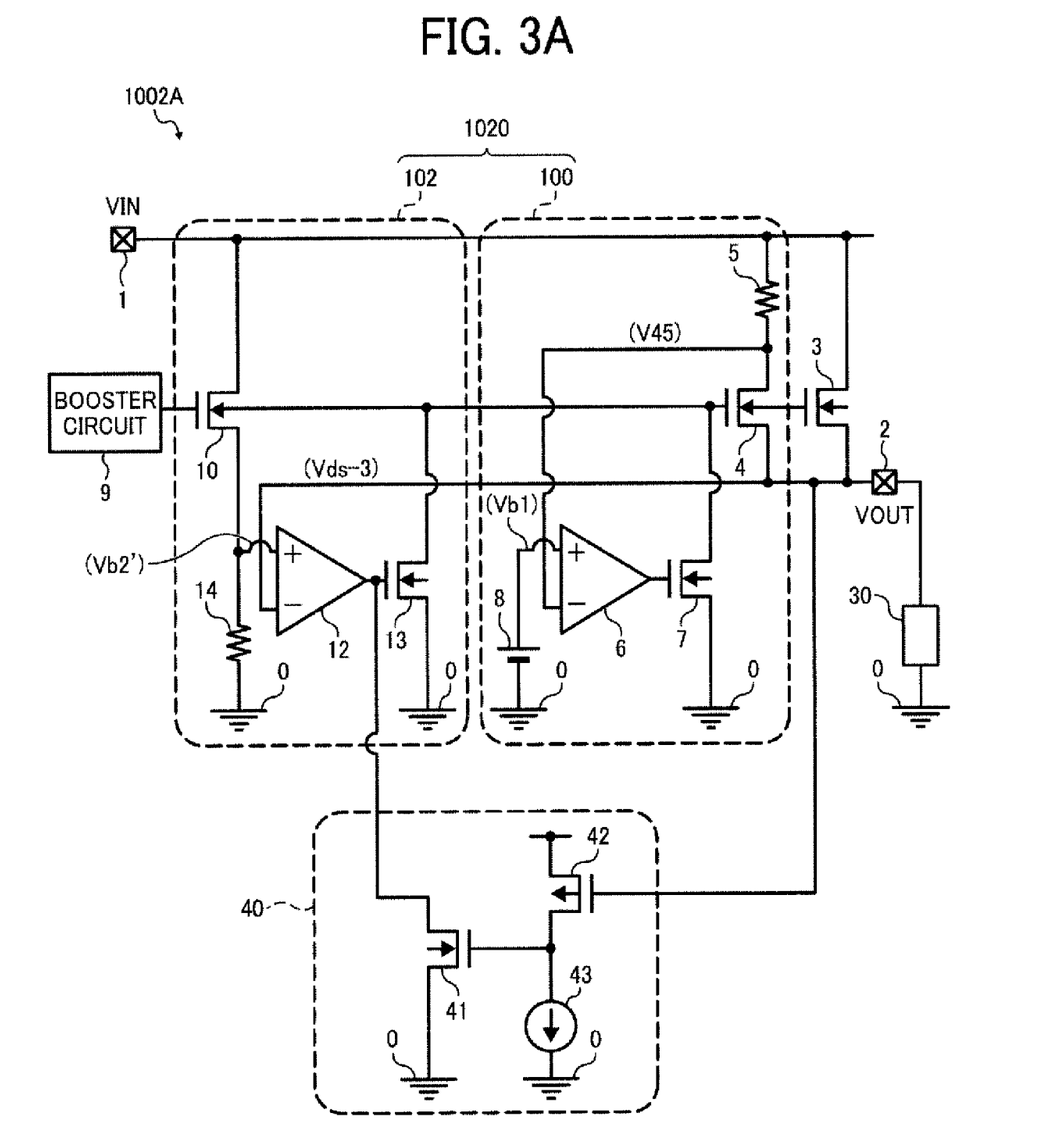
FIGS. 3A and 3B illustrate circuitry of another power supply including another excess-current protection circuit according to a second embodiment.
Figure 3B:
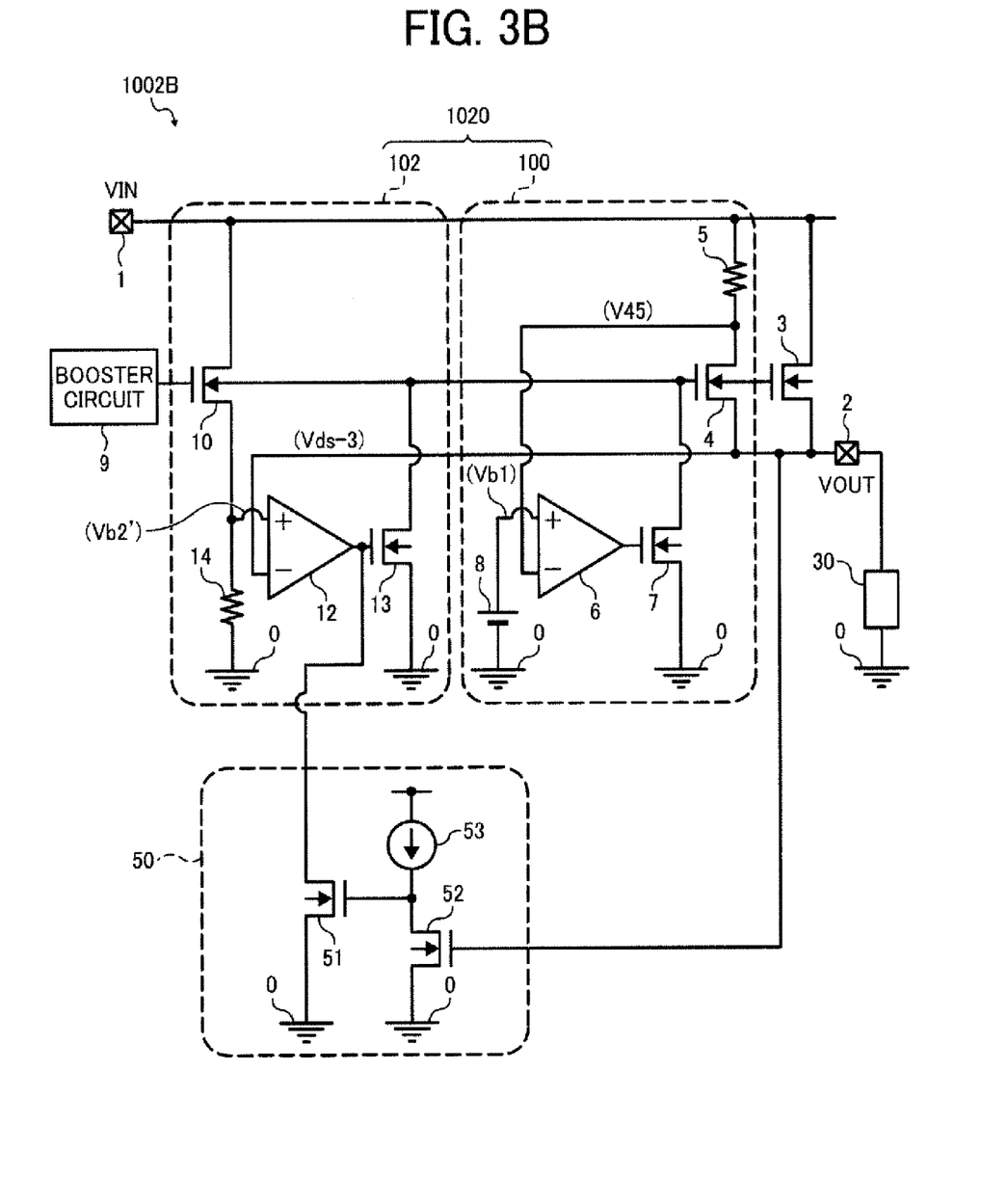

FIGS. 3A and 3B illustrate circuitry of other power supplies 1002A and 1002B including an excess-current protection circuit 1020 according to a second embodiment. The excess-current protection circuit 1020 includes an excess-current detection circuit 102 that differs from the excess-current detection circuit 101. In addition, the excess-current detection circuit 102 includes a resistance element 14 instead of the constant-current source 11 shown in the excess-current detection circuit 101. It is to be noted that, for ease of explanation and illustration, because other than the difference described above excess-current detection circuit 102 has a circuit configuration similar to the circuit configuration of excess-current detection circuit 101 in the first embodiment, other components of the excess-current detection circuit 102 are represented by identical numerals and the description thereof is omitted below.

In this excess-current protection circuit 1020, both excess-current detection circuit 102 and the excess-current control circuit 100 detect the excess-current flowing to the transistor 3 and the control the excess-current. Similar to the first embodiment, the excess-current detection circuit 102 and the excess-current control circuit 100 control the excess current of the output current IOUT in a difference voltage region, as shown FIG. 4C.

Figure 4A:
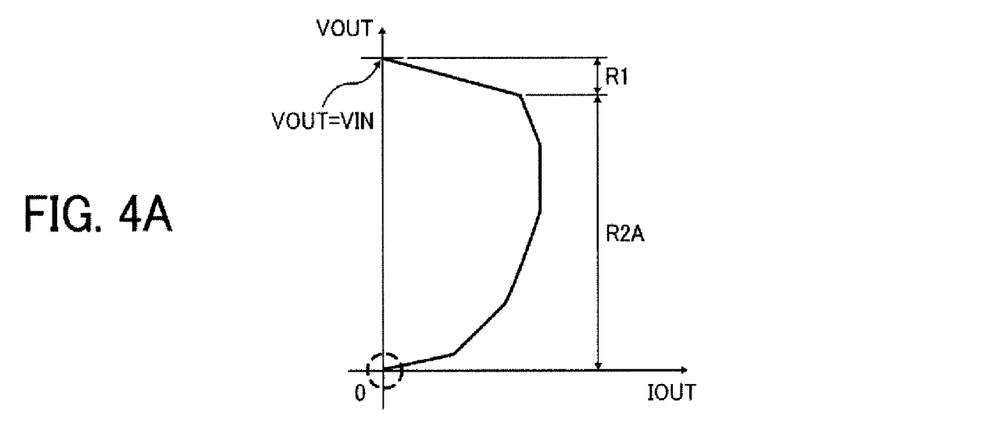
FIG. 4A is a graph of a voltage-current curve illustrating a relation between an output current IOUT and an output voltage VOUT when another excess-current detection circuit is used alone in an excess-current protection circuit.
Figure 4B:
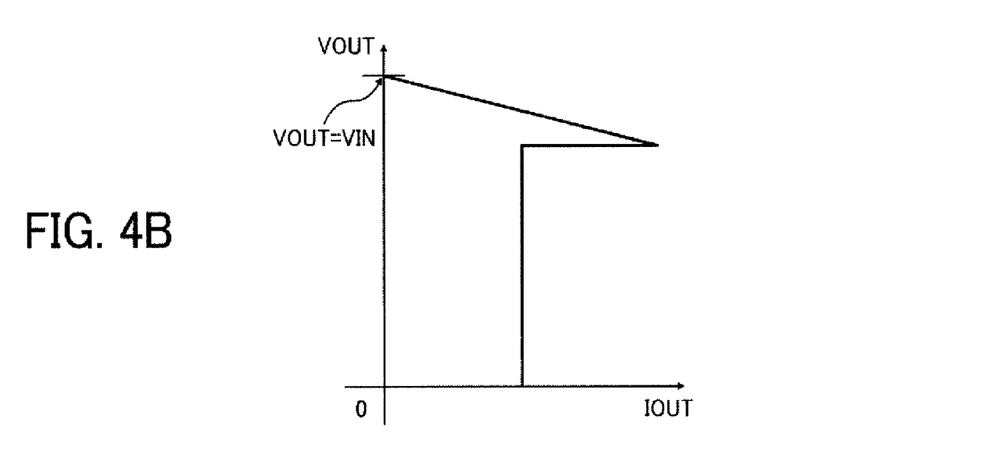
FIG. 4B is a graph of a voltage-current curve illustrating a relation between an output current IOUT and an output voltage VOUT when an excess-current control circuit is used alone as the excess-current protection circuit.
Figure 4C:
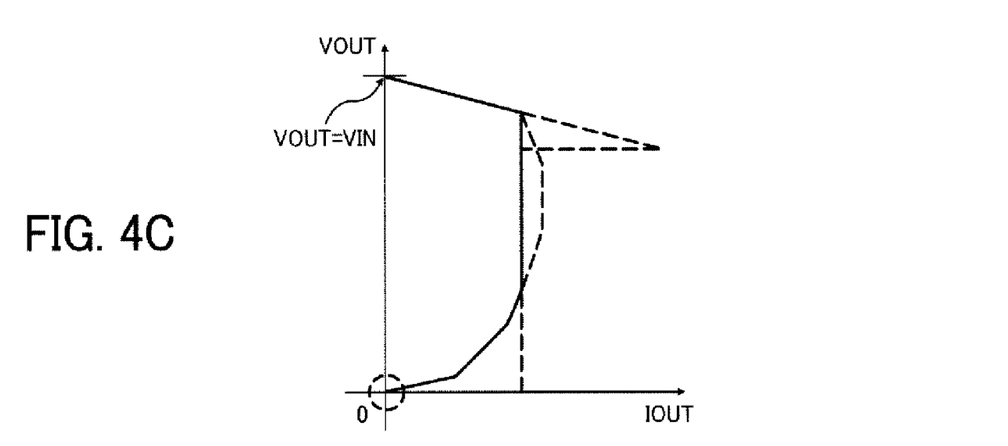
FIG. 4C is a graph of a voltage-current curve illustrating a relation between an output current IOUT and an output voltage VOUT when the excess-current detection circuit and the excess-current control circuit are together used as the excess-current protection circuit according to the second embodiment shown in FIG. 3.

FIG. 4A is a graph of a voltage-current curve illustrating a relation between an output current and an output voltage VOUT when the excess-current detection circuit 102 is used alone in the excess-current protection circuit 1020. FIG. 4B is a graph of a voltage-current curve illustrating a relation between an output current IOUT and an output voltage VOUT when the excess-current control circuit 100 is used alone as the excess-current protection circuit 1020. FIG. 4C is a graph of a voltage-current curve illustrating a relation between an output current IOUT and an output voltage VOUT when the excess-current detection circuit 102 and the excess-current control circuit 100 are together used in the excess-current protection circuit 1020 according to the present embodiment.

As shown in a voltage region R2A in FIG. 4A, in an area in which the output voltage VOUT is close to 0 V, a second voltage Vb2' generated by the sense transistor 10 and the resistor 14 is also close to 0V. Therefore, the current flowing to the resistance element 14 is zero, and the current flowing through the second sense transistor 10 and the driver transistor 3 is also zero.

Consequently, this embodiment requires an external circuit, such as a supplementary circuit 40 or 50 as shown in FIGS. 3A and 3B, to prevent the excess-current detection circuit 102 from operating when the output VOUT is small. The supplementary circuit 40 includes a NMOS transistor 41, a positive-channel MOS (PMOS) transistor 42, and a current source 43. The supplementary current circuit 50 includes NMOS transistors 51 and 52 and a current source 53. When the output voltage VOUT is small in the excess-current protection circuit 1020, either supplementary circuit 40 or 50 controls the output MOS transistor 13 to connect the gate of the output MOS transistor 13 to the ground terminal 0. Thus, either supplementary circuit 40 or 50 stops operation of the excess-current detection circuit 102.

Third Embodiment

Figure 5:
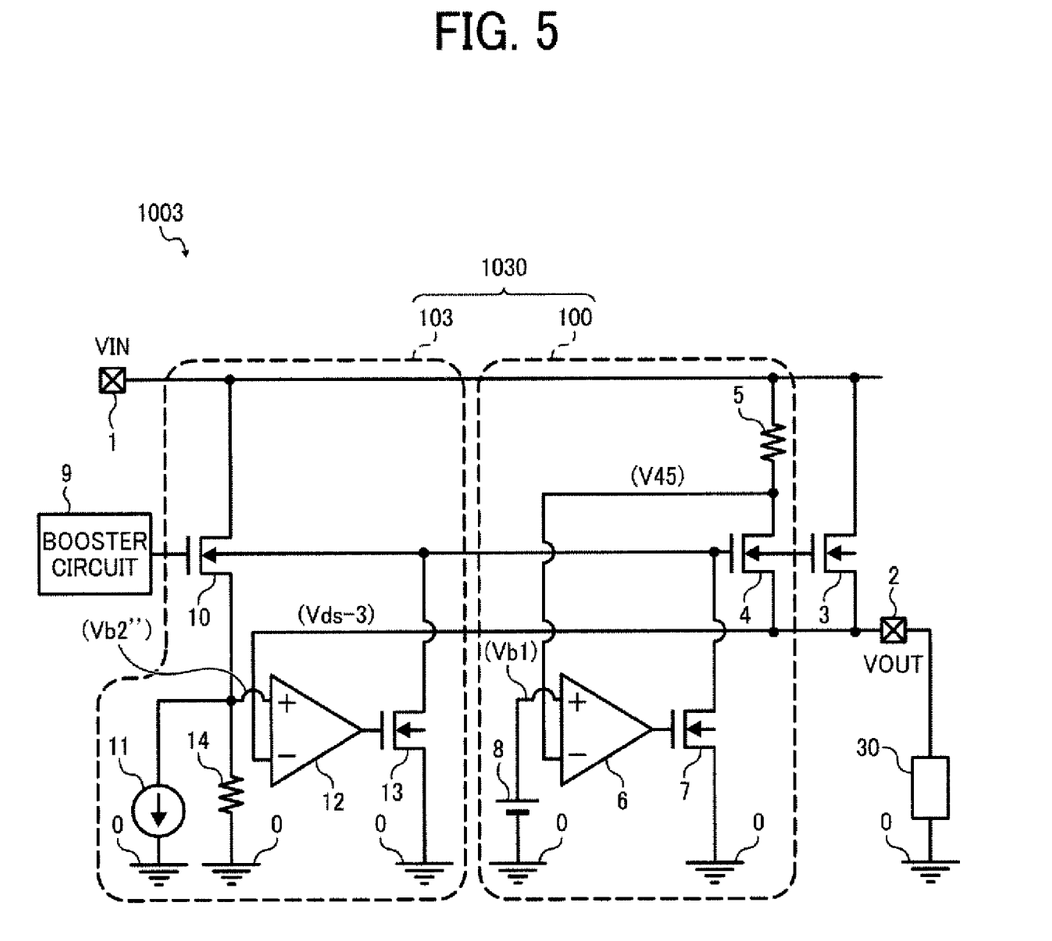
FIG. 5 illustrates circuitry of another power supply 1002 including another excess-current protection circuit according to a third embodiment.

FIG. 5 illustrates circuitry of another power supply 1003 including an excess-current protection circuit 1030 according to a third embodiment.

Figure 6A:
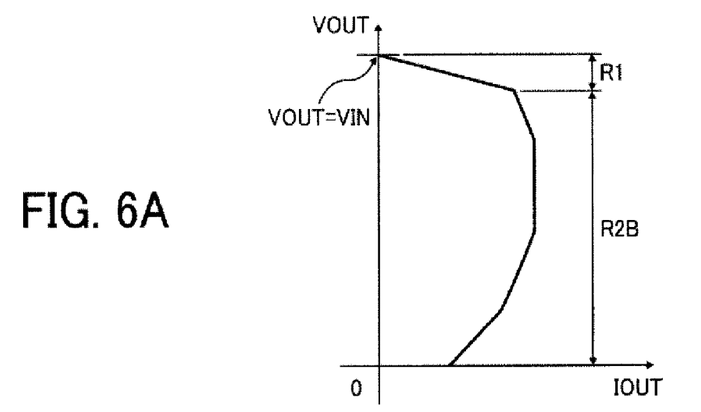
FIG. 6A is a graph of a voltage-current curve illustrating a relation between an output current IOUT and an output voltage VOUT when another excess-current detection circuit is used alone in an excess-current protection circuit.
Figure 6B:
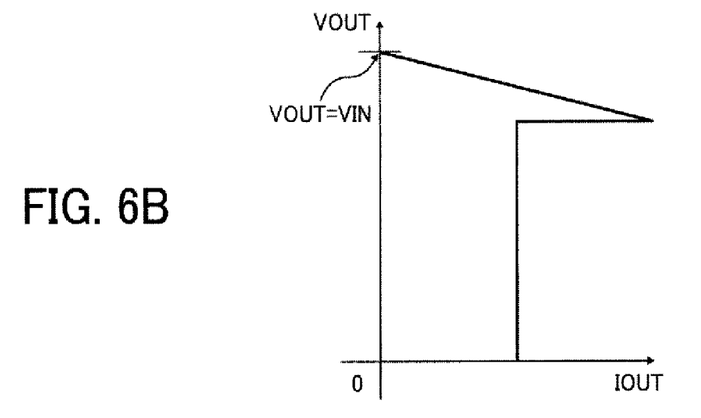
FIG. 6B is a graph of a voltage-current curve illustrating a relation between an output current IOUT and an output voltage VOUT when the excess-current control circuit is used alone as the excess-current protection circuit.
Figure 6C:
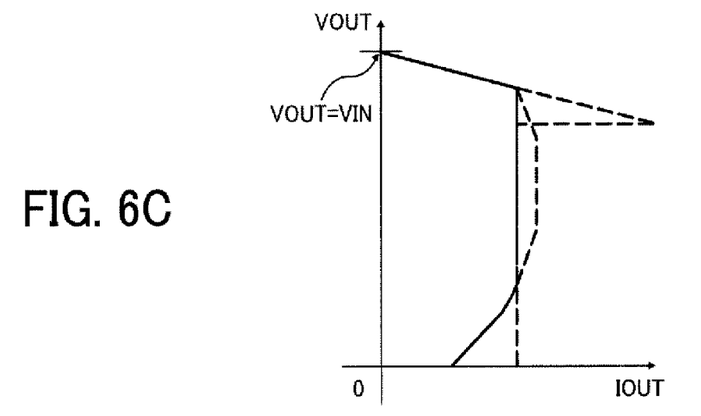
FIG. 6C is a graph of a voltage-current curve illustrating a relation between an output current IOUT and an output voltage VOUT when the excess-current detection circuit and the excess-current control circuit are together used as the excess-current protection circuit of the third embodiment shown in FIG. 5.

Similar to the first embodiment, the excess-current detection circuit 103 and the excess-current control circuit 100 control the excess current of the output current IOUT in a difference voltage region, as shown FIG. 6C.

In the third embodiment, the excess-current protection circuit 1030 includes an excess-current detection circuit 103 instead of the excess-current detection circuit 101. More specifically, the excess-current detection circuit 102 includes a resistance element 14 instead of the constant current source 11 shown in the excess-current detection circuit 101. It is to be noted that, for ease of explanation and illustration, because other than the difference described above excess-current detection circuit 102 has a circuit configuration similar to the circuit configuration of excess-current detection circuit 101 in the first embodiment, other components of the excess-current detection circuit 102 are represented by identical numerals and the description thereof is omitted below.

In this excess-current protection circuit 1030, both excess-current detection circuit 103 and the excess-current control circuit 100 detect the excess-current flowing to the transistor 3 and the control the excess-current. Similar to the first embodiment, the excess-current detection circuit 103 and the excess-current control circuit 100 control the excess current of the output current IOUT in a difference voltage region, as shown FIG. 6C.

FIG. 6A is a graph of a voltage-current curve illustrating a relation between an output current IOUT and an output voltage VOUT when the excess-current detection circuit 103 is used alone in the excess-current protection circuit 1030. FIG. 6B is a graph of a voltage-current curve illustrating a relation between an output current IOUT and an output voltage VOUT when the excess-current control circuit 100 is used alone as the excess-current protection circuit 1030. FIG. 6C is a graph of a voltage-current curve illustrating a relation between an output current IOUT and an output voltage VOUT when the excess-current detection circuit 103 and the excess-current control circuit 100 are together used in the excess-current protection circuit 1030 according to the present embodiment. The excess-current protection circuit 1030 includes the constant-current source 11, therefore, a second voltage Vb2" generated by the sense transistor 10, the resistor 14, and the constant-current source 11 is not close to 0 V, and the current Id flowing to the second sense transistor 10 and the driver transistor 3 is not limited to 0 V.

That is, in a voltage region R2B in FIG. 6A, when output VOUT is 0V (VOUT=0V), the constant current Id still flows to the second sense transistor 10 and the driver transistor 3, and therefore an external circuit to increase the output voltage VOUT like that in the second embodiment is not required in this embodiment.

Fourth Embodiment

Figure 7:
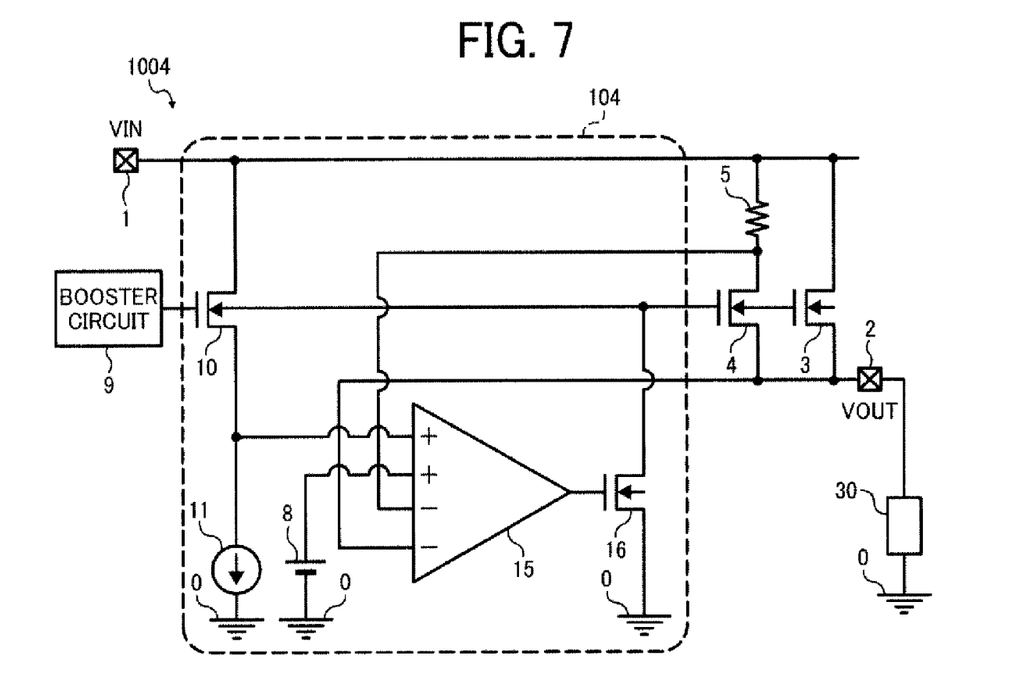
FIG. 7 illustrates circuitry of another power supply including an excess-current protection circuit according to a fourth embodiment similar to FIG. 1.
Figure 8:
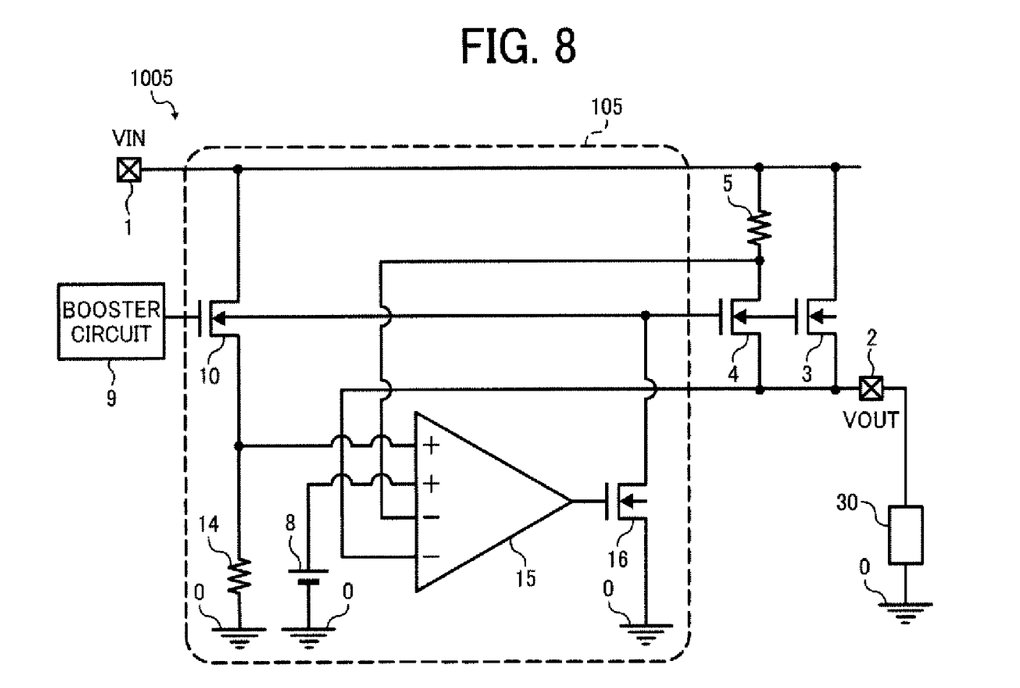
FIG. 8 illustrates circuitry of another power supply including an excess-current protection circuit according to a fourth embodiment similar to FIG. 3.
Figure 9:
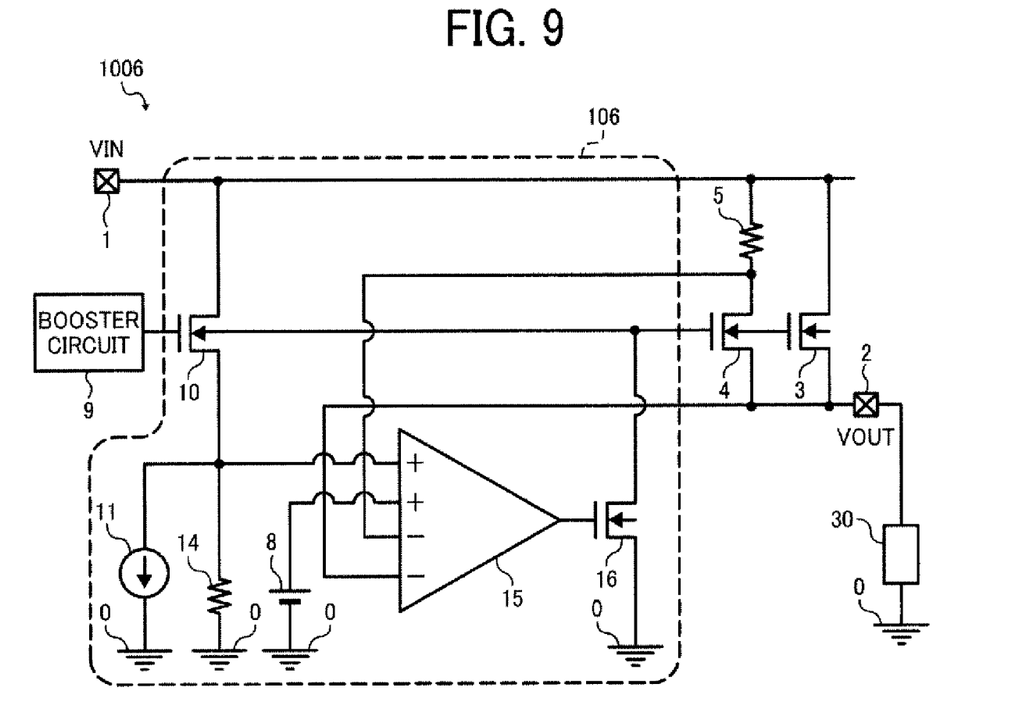
FIG. 9 illustrates circuitry of another power supply including an excess-current protection circuit according to a fourth embodiment similar to FIG. 5.

FIGS. 7, 8, and 9 illustrate the circuitries of excess-current protection circuits 104, 105, 106 according to a fourth embodiment.

The excess-current protection circuits 104, 105, and 106 include a comparator 15, which functions as a differential amplifier including double non-inverting terminals (+) and double inverting terminals (−), and is formed by combining the differential amplifiers used as the first comparator 3 and the second comparator 12 in the excess-current detection circuit 102, 103 and 104. Therefore, the excess-current protection circuits 104, 105, 106 can provide an effect similar to the excess-current protection circuits 1010, 1020, and 1030 described above.

Figure 10A:
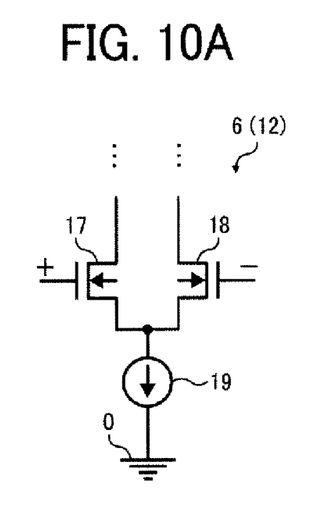
FIG. 10A illustrates circuitry of differential amplifiers provided in the excess-current protection circuit shown in FIGS. 1, 3, and 5.
Figure 10B:
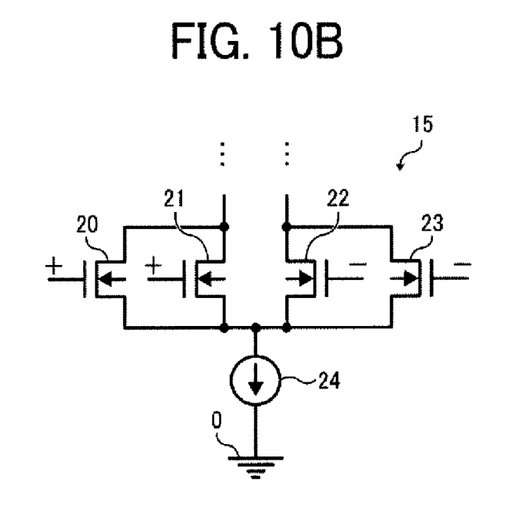
FIG. 10B illustrates circuitry of input portions of the differential amplifiers provided in the excess-current protection circuits shown in FIGS. 7, 8, and 9.

FIG. 10A illustrates circuitry of input portions of the first comparator 6 and the second comparator 2 functioning as differential amplifiers in the excess-current protection circuit 1010, 1020, and 1030. FIG. 10B illustrates circuitry of input portions of the differential amplifiers 15 in the excess-current protection circuits 104, 105, and 106. In FIG. 10A, the input portions of the differential amplifiers 6 and 12 are constituted by transistors 17 and 18, and a current source 19. In FIG. 10B, the input portion of a differential amplifier 15 is constituted by transistors 20, 21, 22, and 23, and a current source 24. The differential amplifier 15 according to the present embodiment includes two input terminals and two input terminals.

In the present embodiment, because the differential amplifiers 6 and 12 are combined to form the differential amplifier 15, the number of circuit elements can be reduced as can the consumption of current.

Variation

It is to be noted that although in the above described embodiments NMOS transistors are used as the driver transistor 3, the first sense transistor 4, and the second sense transistor 10, alternatively PMOS transistors can be used as these transistors.

In this case, the polarity of the comparators 6 and 12, and the polarity of the output PMOS transistors 7 and 13 can be changed as applicable. Accordingly, the booster circuit 9 can be omitted in the circuit using the PMOS transistors.

Additionally, it is to be noted that NMOS transistor and a PMOS transistor can be used for the output MOS transistors 7 and 13 in the excess-current protection circuits 1010, 1020, and 1020.

Further, in the above description, although the load 30 is connected to the output terminal 2 and the output current is outputted from the output terminal 2 to the load 30 according to the excess-current protection circuits 1010, 1020, 1030, 104, 105, and 106, alternatively the load 30 can be connected between the power supply terminal and input terminal 1, and the current can flow from the load to the input terminal 1.

In view of the foregoing, the excess-current protection circuits according to the present invention can control and detect excess current accurately, and is useful for and applicable to power supply.

Numerous additional modifications and variations are possible in light of the above teachings. It is therefore to be understood that, within the scope of the appended claims, the disclosure of this patent specification may be practiced otherwise than as specifically described herein.

What is claimed is:

1. An excess-current protection circuit comprising:
   an outer input terminal;
   an outer output terminal;
   a driver transistor, connected between the outer input terminal and the outer output terminal, to control an excess current; and
   an excess-current control circuit the excess-current control circuit comprising a first sense transistor connected in parallel to the driver transistor to flow a current in accordance with a predetermined ratio through the driver transistor, a sense resistor connected between the first sense transistor and the outer input terminal, a first comparator to compare a predetermined first bias voltage with a voltage obtained by a current flowing through the first sense transistor multiplied by a resistance value of the sense resistor and output an output signal based on a comparison result, and a control member to control a gate voltage of the driver transistor in accordance with the output signal from the first comparator;

an excess-current detection circuit to compare voltage between the drain-source of the driver transistor and a predetermined second bias voltage, the excess-current detection circuit including an output transistor to control the gate voltage of the driver transistor in accordance with a comparison result; and a supplementary circuit configured to connect the gate of the output transistor to ground and prevent the excess-current detection circuit from controlling the gate voltage of the driver transistor, in a case that a voltage at the outer output terminal approaches or equals zero.

2. The excess-current protection circuit according to claim 1, wherein a detected value of the excess-current detection circuit is designed to be larger than a control value of the excess-current control circuit.

3. The excess-current protection circuit according to claim 1, wherein the excess-current detection circuit comprises:
   a second sense transistor having a drain terminal and an input terminal connected in common to a drain terminal and an input terminal of the driver circuit;
   a current source, connected in series to the second sense transistor;
   a second comparator, having an input terminal and an output terminal, to compare a voltage between the driver transistor and the outer output terminal with a voltage between the second transistor and the current source and output a comparison result; and
   the output transistor having a gate terminal connected to the output terminal of the second comparator and an input terminal connected to the gate terminals of the first sense transistor and the second sense transistor.

4. The excess-current protection circuit according to claim 3, wherein a single differential amplifier constitutes the first comparator in the excess-current control circuit and the second comparator in the excess-current detection circuit.

5. The excess-current protection circuit according to claim 1, the excess-current detection circuit comprising:
   a second sense transistor having a drain terminal and an input terminal connected in common to a drain terminal and an input terminal of the driver circuit;
   a resistance element, connected in series to the second sense transistor;
   a second comparator, having an input terminal and an output terminal, to compare a voltage between the driver transistor and the outer output terminal with a voltage between the second transistor and the current source and output a comparison result; and
   the output transistor having a gate terminal connected to the output terminal of the second comparator and an input terminal connected to the gate terminals of the first sense transistor and the second sense transistor.

6. The excess-current protection circuit according to claim 5, wherein a single differential amplifier constitutes the first comparator in the excess-current control circuit and the second comparator in the excess-current detection circuit.

7. The excess-current protection circuit according to claim 5, the excess-current detection circuit further comprising a current source, connected in parallel to the resistance element.

8. The excess-current protection circuit according to claim 7, wherein a single differential amplifier constitutes the first comparator in the excess-current control circuit and the second comparator in the excess-current detection circuit.

9. The excess-current protection circuit according to claim 1, wherein the supplementary circuit includes:
a supplementary NMOS transistor with a drain terminal connected to ground and a source terminal connected to the gate of the output transistor; and
a supplementary PMOS transistor connected in series with a supplementary current source,
the gate of the supplementary NMOS transistor being connected to a node between the supplementary PMOS transistor and the supplementary current source, and
the gate of the supplementary PMOS transistor being connected to the outer output terminal.

10. The excess-current protection circuit according to claim 1, wherein the supplementary circuit includes:
a first supplementary NMOS transistor with a drain terminal connected to ground and a source terminal connected to the gate of the output transistor; and
a supplementary current source connected in series with a second supplementary NMOS transistor;
the gate of the first supplementary NMOS transistor being connected to a node between the supplementary current source and the second supplementary NMOS transistor, and
the gate of the second supplementary NMOS transistor being connected to the outer output terminal.

11. A power supply that changes an input voltage applied to an input terminal and outputs a specified voltage from an output terminal, comprising:
a load; and
an excess-current protection circuit to protect excess-current from flowing to the output terminal, the excess-current protection circuit comprising:
a driver transistor, connected between the input terminal and the output terminal, to control an excess current comprising a first sense transistor connected in parallel to the driver transistor to flow a current in accordance with a predetermined ratio through the driver transistor, a sense resistor, connected between the first sense transistor and the outer input transistor, a first comparator to compare a predetermined first bias voltage with a voltage obtained by a current flowing through the first sense transistor multiplied by a resistance value of the sense resistor and output an output signal based on a comparison result, and a control member to control a gate voltage of the driver transistor in accordance with the output signal from the first comparator;
an excess-current detection circuit to compare a voltage difference between the drain and the source of the driver transistor with a predetermined second bias voltage, the excess-current detection circuit including an output transistor to control the gate voltage of the driver transistor in accordance with a comparison result; and
a supplementary circuit configured to connect the gate of the output transistor to ground and prevent the excess-current detection circuit from controlling the gate voltage of the driver transistor, in a case that a voltage at the outer output terminal approaches or equals zero.

12. The power supply according to claim 11, wherein a detected value of the excess-current detection circuit is designed to be larger than a control value of the excess-current control circuit in the excess-current protection circuit.

13. The power supply according to claim 11, wherein the excess-current detection circuit comprises:
a second sense transistor having a drain terminal and an input terminal connected in common to a drain terminal and an input terminal of the driver circuit;
a current source, connected in series to the second sense transistor;
a second comparator, having an input terminal and an output terminal, to compare a voltage between the driver transistor and the outer output terminal with a voltage between the second transistor and the current source and output a comparison result; and
the output transistor having a gate terminal connected to the output terminal of the second comparator and an input terminal connected to the gate terminals of the first sense transistor and the second sense transistor.

14. The power supply according to claim 13, wherein a single differential amplifier constitutes the first comparator in the excess-current control circuit and the second comparator in the excess-current detection circuit.

15. The power supply according to claim 11, the excess-current detection circuit comprising:
a second sense transistor having a drain terminal and an input terminal connected in common to a drain terminal and an input terminal of the driver circuit;
a resistance element, connected in series to the second sense transistor;
a second comparator, having an input terminal and an output terminal, to compare a voltage between the driver transistor and the outer output terminal with a voltage between the second transistor and the current source and output a comparison result; and
the output transistor having a gate terminal connected to the output terminal of the second comparator and an input terminal connected to the gate terminals of the first sense transistor and the second sense transistor.

16. The power supply according to claim 15, wherein a single differential amplifier constitutes the first comparator in the excess-current control circuit and the second comparator in the excess-current detection circuit.

17. The power supply according to claim 15, the excess-current detection circuit further comprising a current source, connected in parallel to the resistance element.

18. The power supply according to claim 17, wherein a single differential amplifier constitutes the first comparator in the excess-current control circuit and the second comparator in the excess-current detection circuit.

19. The power supply according to claim 11, further comprising a booster circuit to increase the drain voltage of the second sense transistor.

* * * * *